(12) United States Patent
Sandri et al.

(10) Patent No.: US 9,472,302 B2
(45) Date of Patent: *Oct. 18, 2016

(54) REDUNDANT FUSE CODING

(71) Applicant: Intel Corporation, Santa Clara, CA (US)

(72) Inventors: Jason G. Sandri, Gilbert, AZ (US); Steve J. Brown, Phoenix, AZ (US); Peter R. Munguia, Chandler, AZ (US); Monib Ahmed, Chandler, AZ (US); Adrian R. Pearson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 201 days.

This patent is subject to a terminal disclaimer.

(21) Appl. No.: 13/788,009

(22) Filed: Mar. 7, 2013

(65) Prior Publication Data

US 2014/0254233 A1   Sep. 11, 2014

(51) Int. Cl.
*G11C 17/18* (2006.01)
*G11C 17/16* (2006.01)
*G11C 8/20* (2006.01)

(52) U.S. Cl.
CPC *G11C 17/18* (2013.01); *G11C 8/20* (2013.01)

(58) Field of Classification Search
CPC ........ G11C 17/00; G11C 17/16; G11C 17/18
USPC .............................. 365/94, 200, 96; 345/544
See application file for complete search history.

(56) References Cited

U.S. PATENT DOCUMENTS

| | | | | |
|---|---|---|---|---|
| 5,113,371 A * | 5/1992 | Hamada | ........................ | 365/200 |
| 5,195,057 A * | 3/1993 | Kasa et al. | .................... | 365/200 |
| 5,617,364 A * | 4/1997 | Hatakeyama | .................. | 365/200 |
| 6,065,141 A * | 5/2000 | Kitagawa | ...................... | 714/711 |
| 6,205,515 B1 * | 3/2001 | Huang | .......................... | 711/104 |
| 8,122,307 B1 * | 2/2012 | Lindhorst et al. | ............ | 714/719 |
| 2007/0255981 A1 * | 11/2007 | Eto | ................. | 714/710 |
| 2009/0010424 A1 * | 1/2009 | Qi et al. | .......................... | 380/28 |
| 2009/0141573 A1 * | 6/2009 | Hsueh et al. | ................ | 365/201 |
| 2009/0154244 A1 * | 6/2009 | Shiga | ........................ | 365/185.11 |
| 2011/0012906 A1 * | 1/2011 | Kawase et al. | ............... | 345/544 |
| 2011/0141791 A1 * | 6/2011 | Ahmed | ........................... | 365/94 |
| 2012/0102334 A1 * | 4/2012 | O'Loughlin et al. | ......... | 713/189 |
| 2014/0095947 A1 * | 4/2014 | Mozak et al. | ................ | 714/718 |

* cited by examiner

*Primary Examiner* — Hoai V Ho
*Assistant Examiner* — Muna A Techane
(74) *Attorney, Agent, or Firm* — Trop Pruner & Hu, P.C.

(57) ABSTRACT

In accordance with some embodiments, fuse information may be written into a fuse array in a way that provides sufficient redundancy, making it harder for malicious parties to attack the fuse array.

29 Claims, 10 Drawing Sheets

REDUNDANT FUSE CODING

BACKGROUND

This relates generally to fuse sensing.

Fuse sensing refers generically to the sensing of memory arrays, including bits arranged in rows and columns. Generally, a row may be sensed at a time and the address for that row may be chosen in a number of different ways.

Examples of storage elements that use fuse sensing include fuses, non-volatile memories, one time programmable memories, and on-die programmable fuses. One characteristic of current fuse sensing protocols is that the fuse sensing is performed in the same order every time. The order or sequence of selected rows is always the same.

This exposes the fuse sensing protocol to so-called side channel attack methods, such as Differential Electromagnetic Analysis (DEMA), Differential Power Analysis (DPA), and Latent Trait Models (LTM), as examples. The values of the fuses can be determined during fuse sensing. By placing the device in an infinite reset loop and taking measurements over the same location of the device at the same time from the reset of each loop, a hacker can build up a signature of the fuse values within the device. As sensitive assets are sometimes stored in fuses, protection against these types of attacks is very important.

BRIEF DESCRIPTION OF THE DRAWINGS

Some embodiments are described with respect to the following figures.

DETAILED DESCRIPTION

In accordance with some embodiments, fuse information may be written into a fuse array in a way that provides sufficient redundancy, making it harder for malicious parties to attack the fuse array.

There are a variety of ways for attacking fused arrays. One technique simply changes the state of the fuse. Thus, as an example, suppose a bit being in a zero state indicates that the user has not paid. By raising the voltage on the fuse array during a read attempt, a hacker may change the zero stored in a fuse to be read as a one so that the hacker can obtain service for free. Other attacks target sense amplifiers. There are a wide variety of still other ways to avoid paying for various services by circumventing fuses.

In one embodiment described herein, on-die programmable fuses may be used. On-die programmable fuses may be programmed by entities other than the chip manufacturer after the fuse array chip has been manufactured and shipped out. However, other non-volatile memories may also be used.

Figure 1:
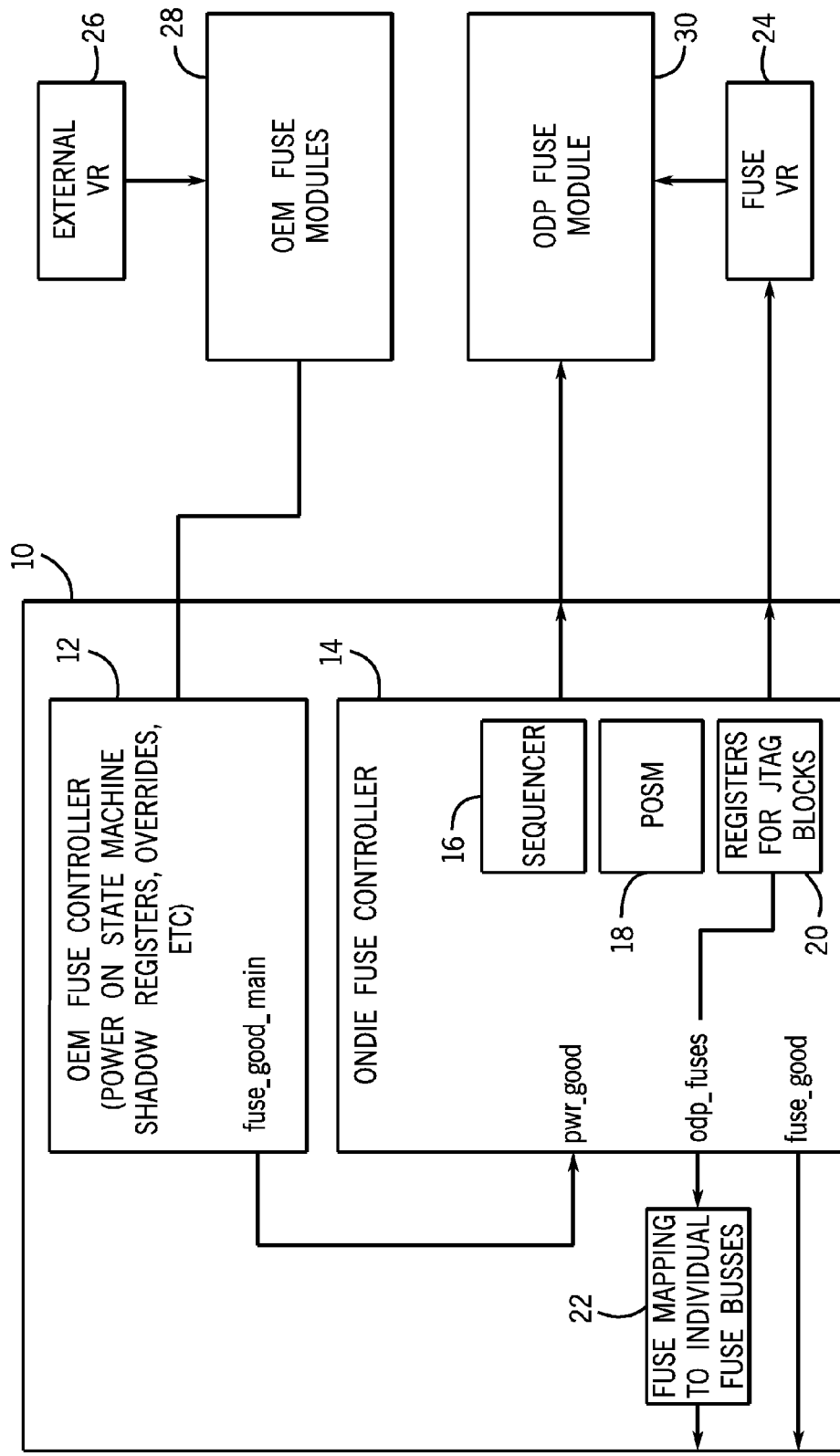
FIG. 1 is a schematic depiction for one embodiment.

Referring to FIG. 1, a die 10 may include an original equipment manufacturer fuse controller 12 and on-die or user programmable fuse controller 14. The on-die fuse controller 14 may be coupled to a fuse mapping to individual fuse buses 22. This allows different interfaces to interact with the on-die fuse controller 14. These interfaces will be described and shown subsequently.

The on-die fuse controller may include a sequencer 16 that performs automatic programming of the on-die programmable fuse module 30. In other words, the user can simply indicate the programming that the user desires and the sequencer 16 automatically takes care of implementing all the steps needed to actually perform and implement the fuse programming. Also coupled to the sequencer 14 is a power on state machine 18, which may be responsible for randomly sensing/programming the fuse module rows. That is, the selection of rows for programming may be done automatically and randomly to prevent (or reduce the likelihood of) a hacker interfering with that programming. The controller 14 also includes registers for Joint Test Action Group (JTAG) blocks 20.

The die 10 is coupled to a fuse voltage regulator 24, in turn coupled to the on-die programmable fuse module 30. An external voltage regulator 26 may be coupled to the original equipment manufacturer (OEM) fuse modules 28.

In some embodiments, the on-die fuse controller 14 and the on-die programmable fuse modules 30 are completely isolated from, and independent of the original equipment manufacturer fuse controller 12 and the original equipment manufacturer fuse modules 28. This blocks another avenue for a hacker to access the original equipment manufacturer fuse modules.

Figure 2:
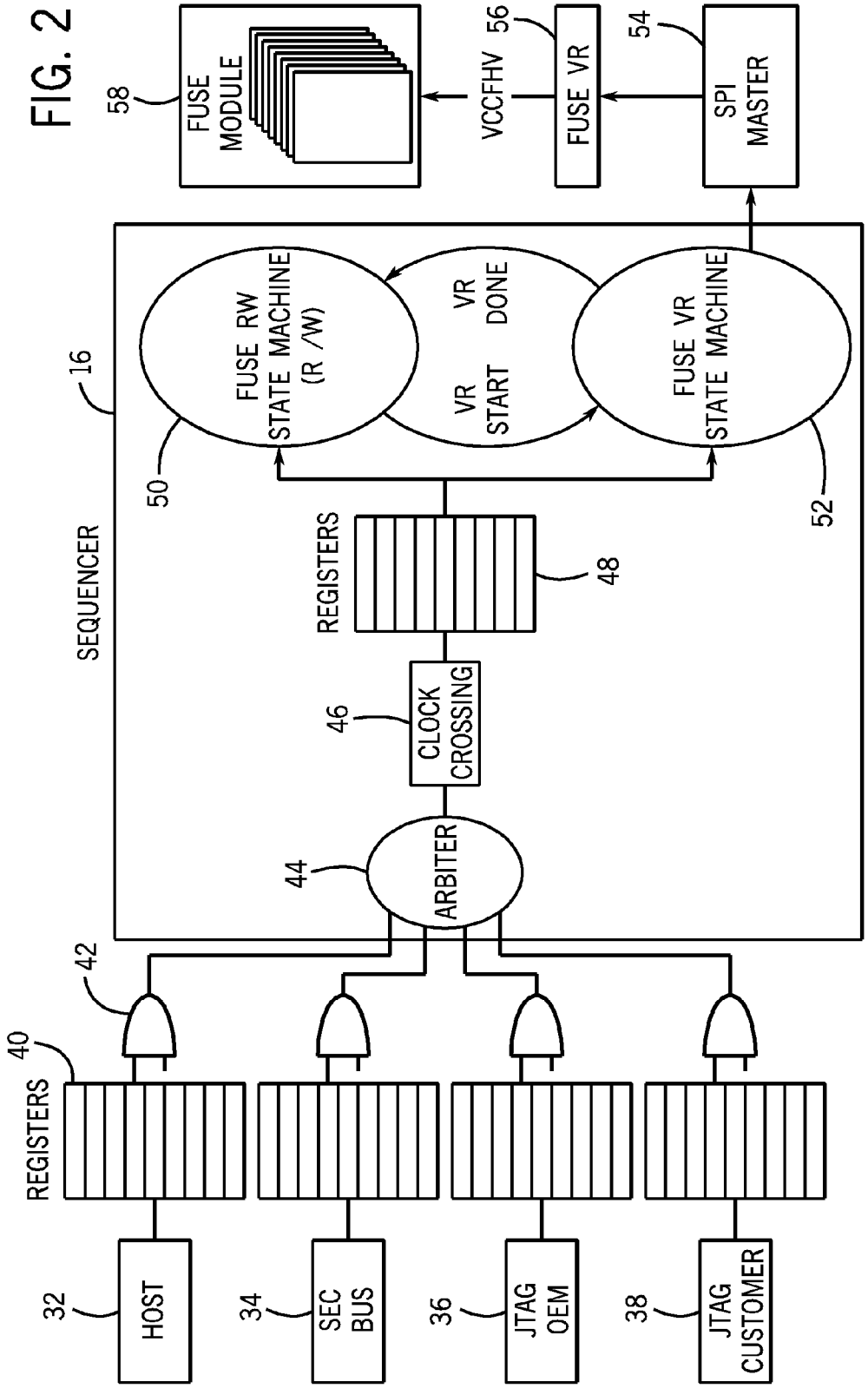
FIG. 2 is a schematic depiction of the sequencer shown in FIG. 1 according to one embodiment.

Thus, referring to FIG. 2, in one embodiment, four different interfaces for the on-die programmable fuses are illustrated. The first interface is the host computer 32. Another is a security controller interface 34. Still another interface is an original equipment manufacturer JTAG interface 36, and the last interface is a customer JTAG interface 38. Each of the interfaces 32-38 may provide information to dedicated registers 40, which communicate with the sequencer 16 via an OR gate 42.

The OR gate is controlled so that only one interface at a time can provide signals to a sequencer 16. The communications with the sequencer 16 are via atomic accesses only, as enforced by the arbiter 44. The arbiter 44 is coupled to a crossing detector 46, which stores data from the selected interface in registers 48.

When it is time to write the data into the fuse module 58, the fuse read/write state machine 50 issues a voltage regulator (VR) start signal to the fuse voltage regulator state machine 52 when the correct initial voltage is achieved or the desired voltage level is achieved in a multilevel fuse programming. A voltage regulator (VR) done signal is issued to the fuse read/write machine 50. The fuse read/write state machine 50 then issues the programming signals to the appropriate blocks of a fuse module 58 that are selected. At the same time the fuse voltage regulator state machine 52, via a serial parallel interface (SPI) master bus 54 in one embodiment, issues signals to the fuse voltage regulator 56 to drive the programming voltage VCCFHV to the selected fuse block.

The registers 40, for each interface, control all aspects of the fusing recipe, including voltage levels and programming durations. In addition, each interface may have a mechanism such as OR gate 42 to disable the respective interface. The arbiter may be used to determine which interface and type of transaction gains access in the event that more than one interface issues a transaction at the same time.

In some embodiments there are four interfaces and two transaction types. One transaction type is fuse access and the other transaction type is fuse voltage regulator access via the SPI master for each. Each transaction type can be used by each interface. For the fuse access from each of the four interfaces, a bit 31 of an address register may be used to indicate to the arbiter that a transaction is ready.

Once the arbiter sees the bit 31 is set, it accepts the transaction and sends it to the sequencer 16. After the arbiter has sent the information to the sequencer, the arbiter waits until a done bit is set. Then the arbiter captures any returned information and outputs that information to the interface that started the transaction. Once the transaction is complete, the arbiter accepts the next transaction.

The state machine 50 takes all of the inputs from the arbiter and performs the proper transactions as requested by the user. It communicates with the fuse module 58 and the voltage regulator state machine 52 and maintains proper timing for all operations, in some embodiments. The fuse voltage regulator state machine handles all transactions between the read/write state machine and the voltage regulator and is responsible for all timing requirements, in some embodiments.

The pseudo code for a fuse state machine write is as follows in one embodiment:

```
// Loop through all required voltage phases
For (voltage phase = 0 to 4) {
    // Set the VCCFHVx voltage
    Set VR_Start
    While (VR_Done != 1) { ; }
    // Program all 32 bits (1's only) at current voltage
    for (fusebitpos = 0 to 31) {
        enreg = writedata & (1 << fusebitpos)
        shift enreg data to fuses
        if (enreg != 0) {
            program fuse bit with pgmen sequence to address
        } else {
            same program sequence, never assert pgmen (ie: Don't
            fuse the bit)
            // Keeps programming time the same to avoid detection of
            // programming value based on time to program the 32 bits.
        }
    }
    // Program ECC bits if necessary
    if (ecc module) {
        eccdata = computeECC(writedata)
        for (fusebitpos = 0 to 7) {
            enreg = eccdata & (1 << fusebitpos*(row to ecc slot
            decode))
            if (enreg != 0) {
                shift enreg data to fuses
                program fuse bit with pgmen sequence
            }
        }
    }
}
// Set VCCFHV back to nominal voltage
Set VR_Start (default voltage)
// Read back row just programmed and compare
readdata = sensefuse (address)
If (ecc module) {
    readecc = sensefuse (ecc address)
}
Determine WriteStatus based on data and ecc compare results
```

The pseudo code for a fuse state machine read is as follows:

```
// Read back row just programmed and compare
readdata = sensefuse (address)
If (ecc module) {
    readecc = sensefuse (ecc address)
}
Determine ECC en and ECC and ECC Valid
```

The number of bits that are used to store critical information in a fuse array may be increased. As one example, a single bit may be increased to a string of bits wherein some of the bits are complementary to the other bits. In some embodiments, in addition to storing the string of bits along one accessible row, the bits may also be spread along a column read by successively reading a series of rows. In addition, the bits in the column may also be made to complement the corresponding bits in the row. Then by reading the string bits in the row and the complementary string of bits in the column and comparing the two strings, an attack can be identified.

For example, in the attack where the voltage is raised, an attacker would have to raise the voltage three times, at the right times in order to change each of the bits in the column. And merely changing all the bits to one, would be recognized as an improper fuse value, since each code consists of both ones and zeros. Similarly other attacks could be thwarted.

Figure 3:
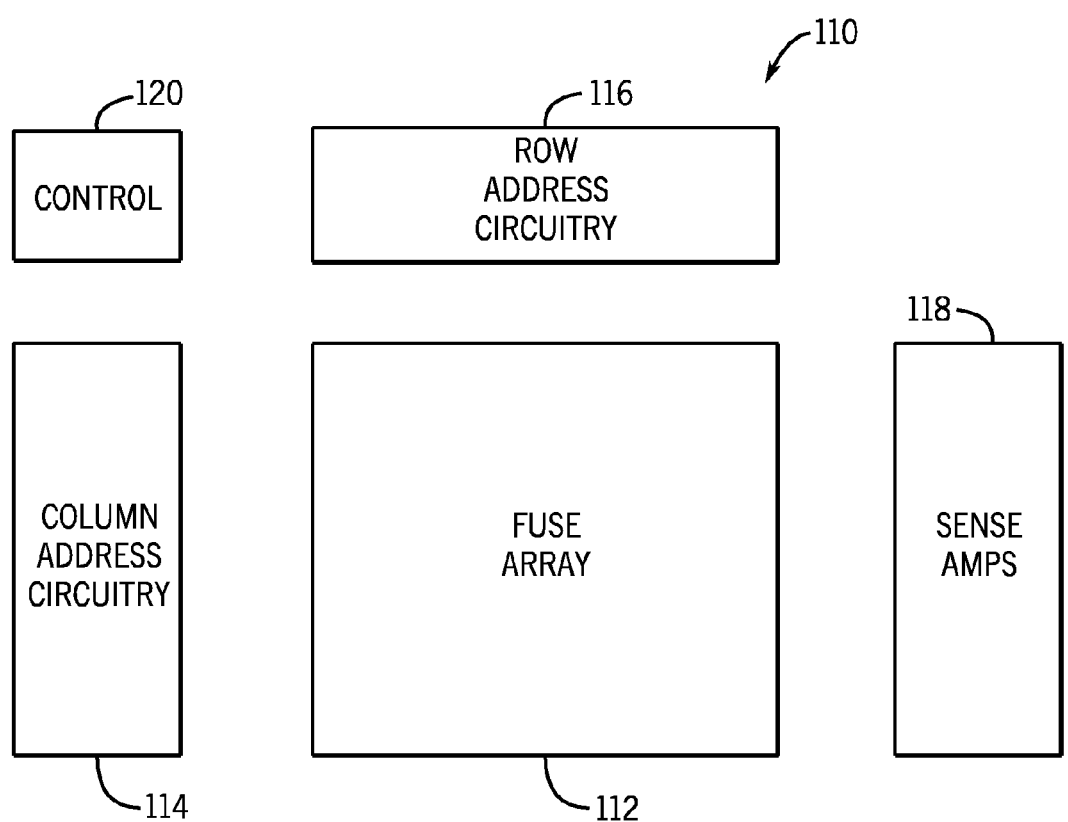
FIG. 3 is a depiction of a fuse array according to one embodiment.

Referring to FIG. 3, a fuse array integrated circuit 110 may include a memory or fuse array 112 containing bits that may be arranged in rows extending vertically along the page and columns extending horizontally across the page. Of course other arrangements are also possible. The columns may be accessed for reading and writing by column address circuitry 114. The rows may be accessed for reading or writing by row address circuitry 116. The states of the accessed cells can be determined using sense amplifiers 118. The operations of the circuitry 114 and 116 and the sense amplifiers 118 may be controlled by a control 120, which may be a microcontroller or a microprocessor, as two examples.

Figure 4:
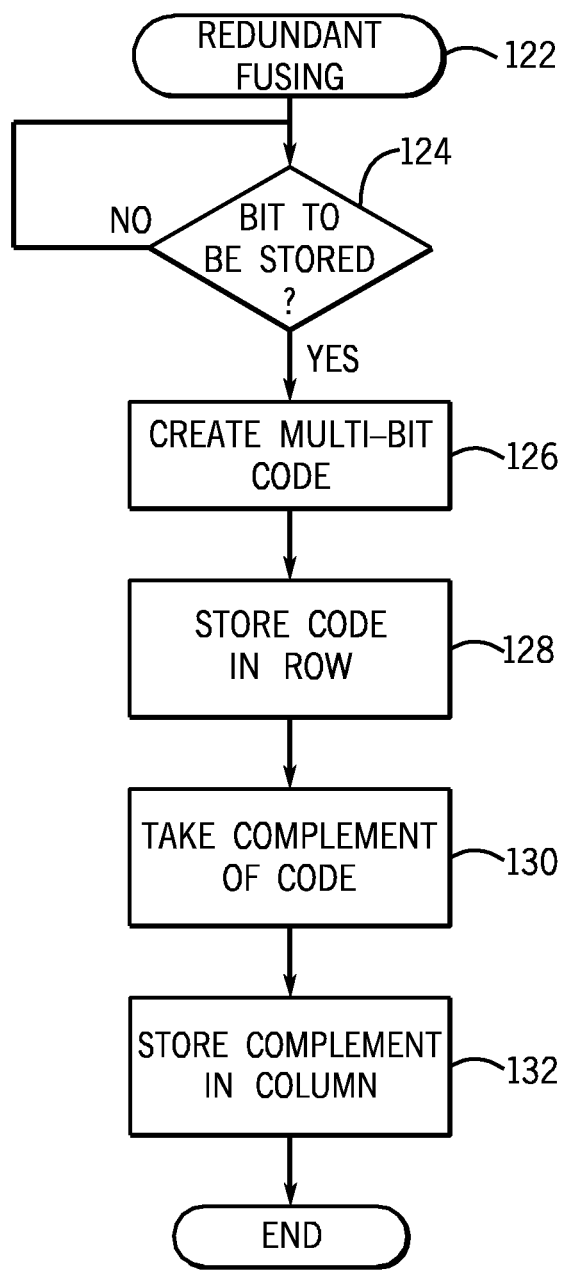
FIG. 4 is a flow chart for redundant fusing according to one embodiment.

Referring to FIG. 4, a sequence 122 for redundant fusing may be implemented in software, firmware or hardware. In software and firmware embodiments, it may be implemented by computer executed instructions stored in one or more non-transitory computer readable media such as magnetic, optical or semiconductor storages. As one embodiment, the sequence may be implemented by the control 120. Other variations are also contemplated.

The sequence 122 begins by determining if there is a bit to be stored as indicated in diamond 124. If so, a multi-bit code string may be created as indicated in block 126. Thus for example, if zero is intended to indicate service provision, then a code string can be made up of more than one bit, wherein for example the central bit indicates the code and the other bits in the string are simply complements of the code. Other variations may be contemplated by those skilled in the art. Then the multi-bit code string is stored along a row, as indicated in block 128, in an addressable location.

Next, the code string is converted to a complement, as indicated in block 130. For example, code 010 is converted into 101. Then the complement code string may be stored along a column. As a result, to get the entire column stored code complement string out, you have to read a series of successive rows in an embodiment in which rows are always read, not columns. Then the complement code is stored in the column as indicated in block 132.

Figure 5:
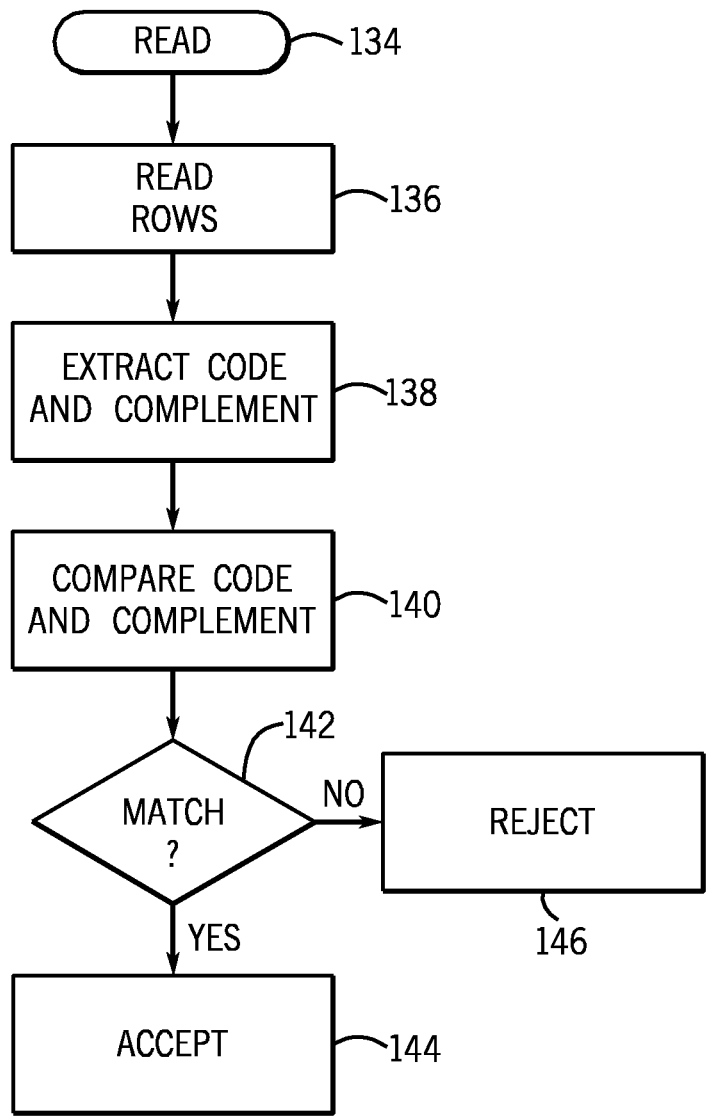
FIG. 5 is a flow chart for a sequence for reading a fuse array according to one embodiment.

When it comes time to access the code string, the sequence 134 shown in FIG. 5 may be used. Like the sequence of FIG. 4, this sequence 134 may be implemented in software, firmware and/or hardware. In software and firmware embodiments it may be implemented by computer executed instructions stored in one or more non-transitory computer readable media, such as magnetic, optical or semiconductor storages. Again, in some embodiments, it may be implemented by the control 120 shown in FIG. 3.

The sequence of FIG. 5 begins by reading rows, one after another, as indicated in block 136. The rows may be read seriatim or the sequence of reading rows may be randomized so that each time the rows are read, a different sequence is used. Then the code string and its complement are extracted, as indicated in block 138, by reading a series of rows including the code and a series of rows including the complement. The code string and its complement are compared as indicated at block 140. If a match is determined at diamond 142, the code string may be accepted as being valid or genuine, as indicated at block 144. Otherwise, the code string may be rejected as indicated in block 146 and the service withheld.

Figure 6:
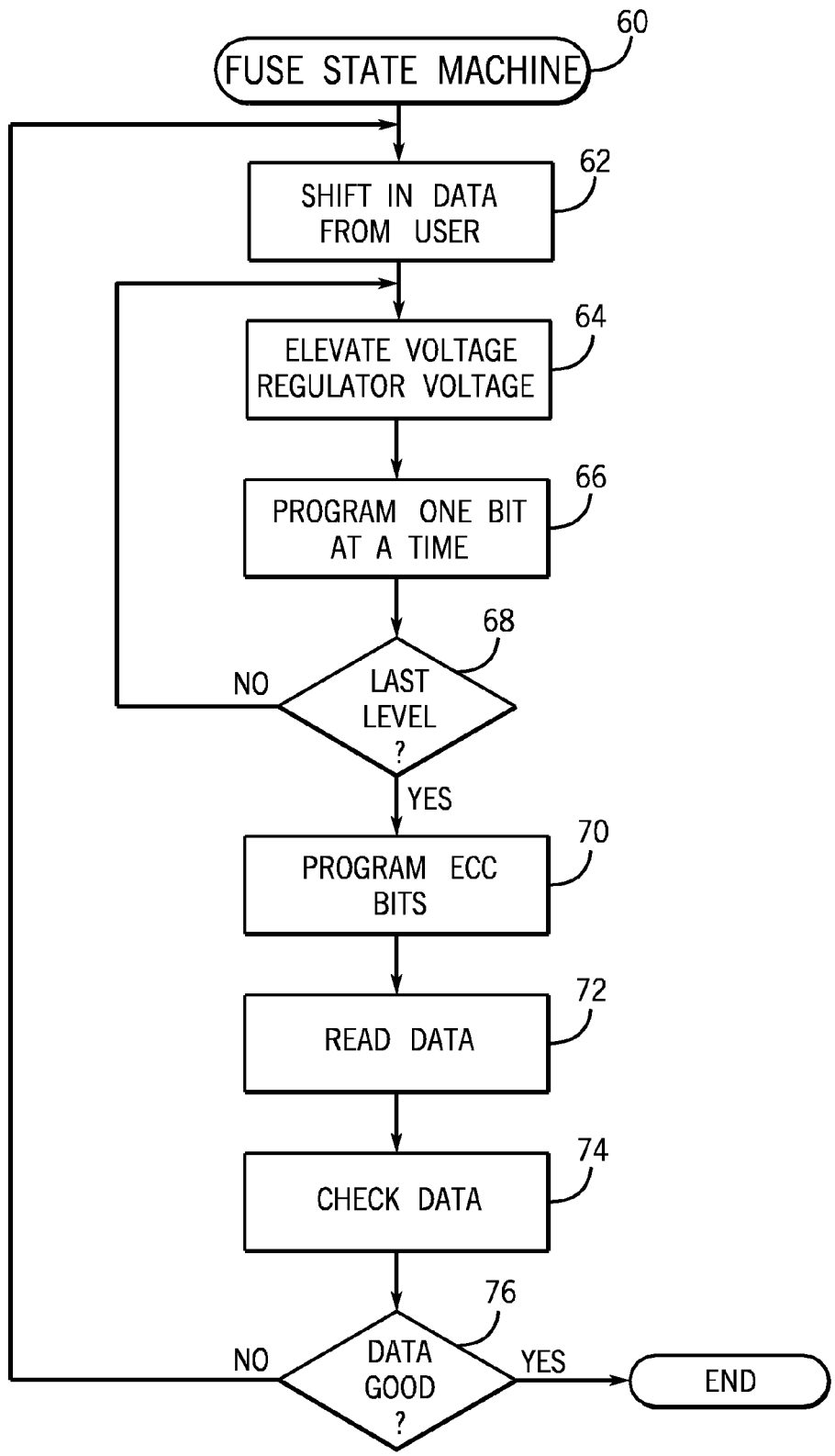
FIG. 6 is a flow chart for a sequence for an on-die programmable fuse array according to one embodiment.

Referring to FIG. 6, in accordance with some embodiments, a fuse state machine write protocol 60 may be implemented in software, firmware and/or hardware. In firmware and software embodiments, it may be implemented by computer executed instructions stored in one or more non-transitory computer readable media, such as magnetic, optical, or semiconductor storages. For example, it may be stored within an appropriate controller, such as the controller 14, in one embodiment.

The state machine 60 sequence may begin by shifting in the data that the user requests be programmed, as indicated in block 62. Then the voltage regulator voltage is elevated, as indicated in block 64. One bit at a time is programmed at the selected voltage level, as indicated in block 66. If this is the last level, the flow ends, as determined in diamond 68. Otherwise, the voltage regulator voltage is elevated to the next level in block 64 and the flow iterates.

After the programming has been completed, the error correction and control (ECC) bits are programmed, as indicated in block 70. Then the just programmed data is read, as indicated in block 72. Finally, the programmed data that has been read out is checked (block 74) using the ECC bits. If the data is correct (diamond 76), the flow ends, and, otherwise, the flow iterates in order to redo the programming.

During a read operation, each row that has been programmed is read back and compared. If the ECC data matches, then the data is valid and can be used.

Figure 7:
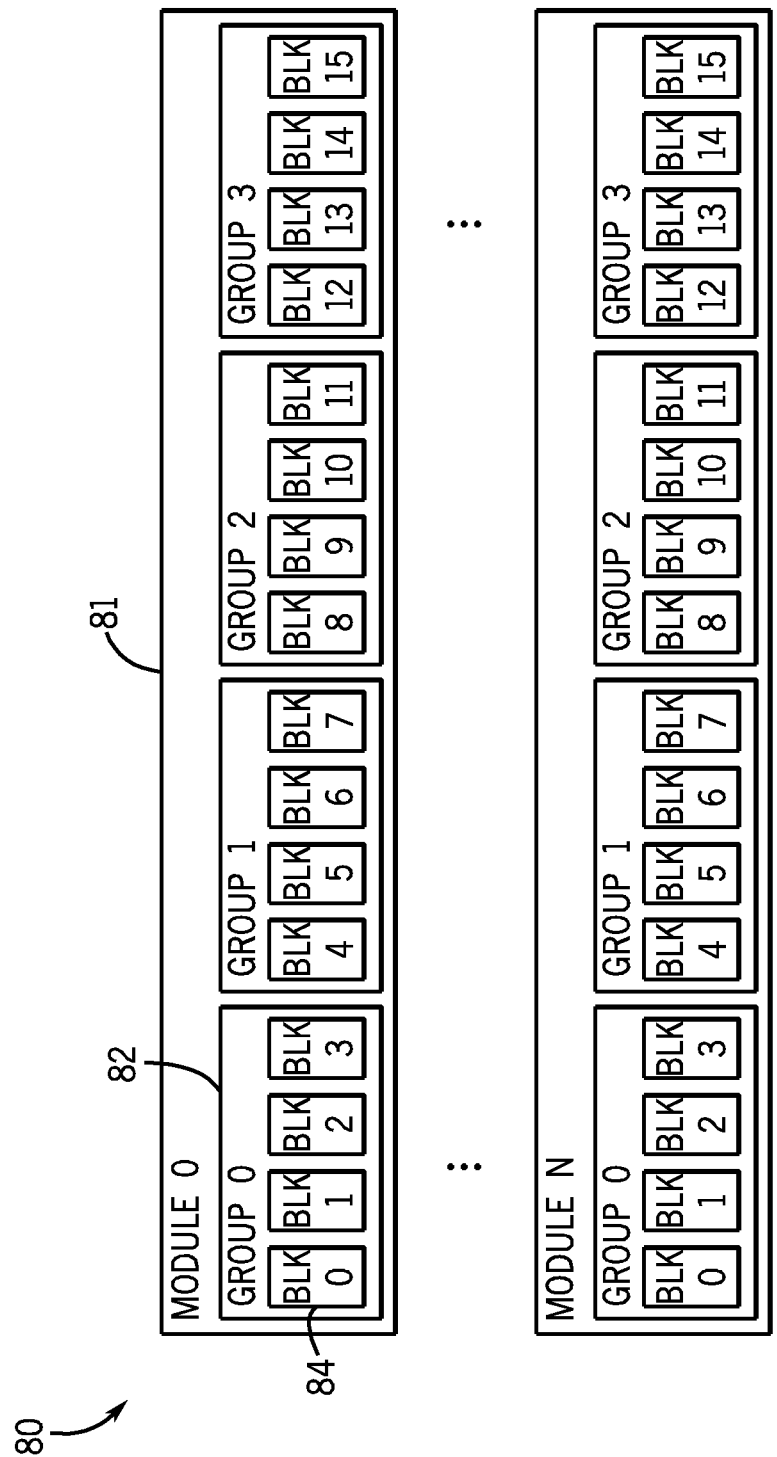
FIG. 7 is a block diagram of a fuse array according to one embodiment.

The fuse array architecture 80, shown in FIG. 7, conventionally includes a plurality of modules. Each module may include four groups. Each group may contain four fuse blocks, which are typically 1000 bits each. Each fuse block may include 32 rows of 32 bits each. Thus, as shown in FIG. 7, a module 0, numbered 81, may include four groups 0-3, numbered 82. Each group includes a plurality of blocks 84. Any number of modules may be combined to create a fuse array 80.

Access to the fuse blocks is via addressing. An address of a row to be sensed is derived as a concatenation of the module number, group number, block number, and row number. Once the fuse row has been sensed from the fuse block using the address, the same address may be used to store the fuse contents into an on-chip random access memory.

The predictability of conventional fuse sensing techniques is typically used to a hacker's advantage in side channel attacks. This avenue of attack may be reduced by randomizing the fuse sensing algorithm. In one embodiment, this randomization may use a random number generator (RNG) to seed a linear feedback shift register counter (LFSR) every time fuse sensing is to be performed. The LFSR is clocked to advance a signal through a register from one to the next most significant bit. Then some outputs are exclusive ORed and fedback to the shift register input. The counter is used to provide the address of the next fuse row to sense. The following pseudo code shows the algorithm:

```
Seed     = RNG
Address  = LFSR (Seed)
foreach (Address) {
    FuseData         = Sense Row [Address]
    RAM [Address]    = FuseData
    Address          = LFSR (Next)
}
```

Figure 8:
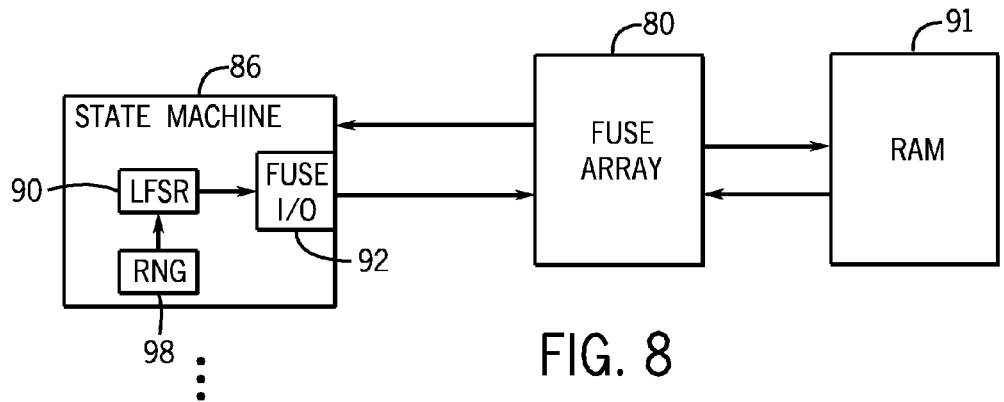
FIG. 8 is a schematic depiction of one embodiment of the present invention.

All of the logic in the fuse sensing state machine 86, shown in FIG. 8, may be based from the randomly computed address. Therefore, the order in which the fuses are sensed and stored into random access memory has no impact on the logic. Using a linear feedback shift register counter to randomize the initial fuse sensing address, prevents hackers from determining the state of the fuses, protecting secure assets.

Thus, as shown in FIG. 8, the state machine 86 may include a random number generator (RNG) 98 that provides the seed to a linear feedback shift register (LFSR) counter 90. This seed changes the starting order of the row selection, and because of the nature of an LFSR, changes the sequence of sensing the rows each time a block of rows is sensed. The shift register counter 90 is provided to a fuse interface (I/F) 92 that then provides the address to the fuse array 80. The output of the fuse array 80 may be stored in a random access memory (RAM) 91, in one embodiment. However, any technique may be used to randomize the addressing protocol. More than one LFSR with an RNG 98 may be used in some embodiments.

Figure 9:
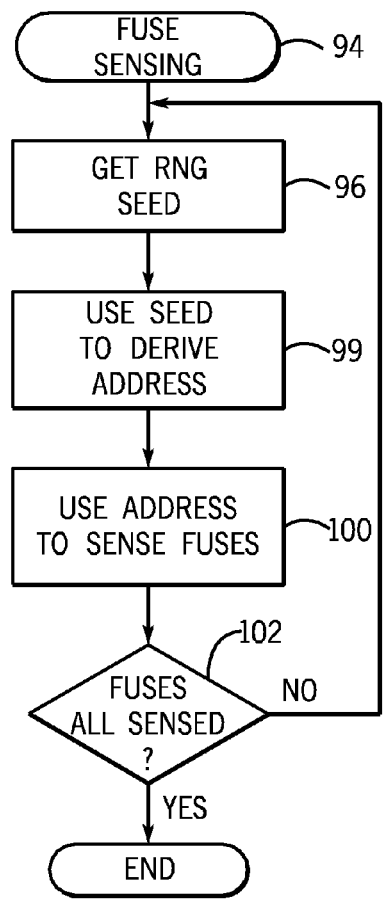
FIG. 9 is a flow chart for fuse sensing array according to one embodiment.

A sequence 94, shown in FIG. 9, for implementing randomized fuse sensing may be implemented in software, firmware, and/or hardware. In software and firmware embodiments, it may be implemented as computer executed instructions stored in one or more non-transitory computer readable media, such as magnetic, optical, or semiconductor memories. Examples of such devices include the state machine 86, as well as conventional processors and conventional random access memories, as other examples. In some embodiments, for example, the linear feedback shift register counter may be a hardware device and, in other embodiments, it may be implemented entirely or partially in software.

The sequence 94, shown in FIG. 9, begins by getting the random number generated seed, as indicated in block 96. Typically, this occurs in response to a request to access the fuse array. Then, the seed is used to derive the address, as indicated in block 99. In one embodiment, the seed may be provided to a linear feedback shift register counter which outputs a randomly generated address in the form of a fuse row address. Then this address is used to pick the first row to sense the selected row of fuses by driving the address to the fuse array 80, as indicated in block 100. Subsequent rows may be selected randomly by the LFSR one after another in order in one embodiment. The LFSR does not select the same row twice; rather it selects an unselected row each time. The fuse array outputs the selected data to the random access memory 91, in one embodiment. Column sensing may be used in other embodiments. In addition, two dimensional block sensing may also be used, where the starting block address is chosen randomly.

A check at diamond 102 determines whether all the rows have then been sensed. If not, the flow iterates and, otherwise, the flow may end.

In some embodiments, multiple random selection techniques may be used. For example, one or more of the module, group, and block may be selected in addition to randomly selected rows of a selected block. That is, a separate LSFR with random number a generated seed may be used for each of the desired granularities from row, to block, to group, to module, in some embodiments.

Other embodiments may use other techniques other than an LFSR. For example, a random number generator may select a row to serve. A storage or scoreboard may store the rows already chosen. So, if a row is re-chosen, as determined by checking the scoreboard, the random selector is ordered to randomly pick another row.

Other techniques for addressing hacking of fuses may be used in combination with the above-described random sensing order concepts, in some cases. These combinations may result in synergistic results in some cases.

In some embodiments, multiple defenses against hacking can be combined. For example, in one embodiment, the random addressing of the fuse array can be combined with separately accessible on-die and non-on-die programmable fuse arrays. In other embodiments, randomly addressed fuse arrays may make use of redundant fuse coding. In other embodiments, the random addressing techniques may be combined with any of the above-described techniques. The present invention is not limited on on-die programmable fuse embodiments.

Figure 10:
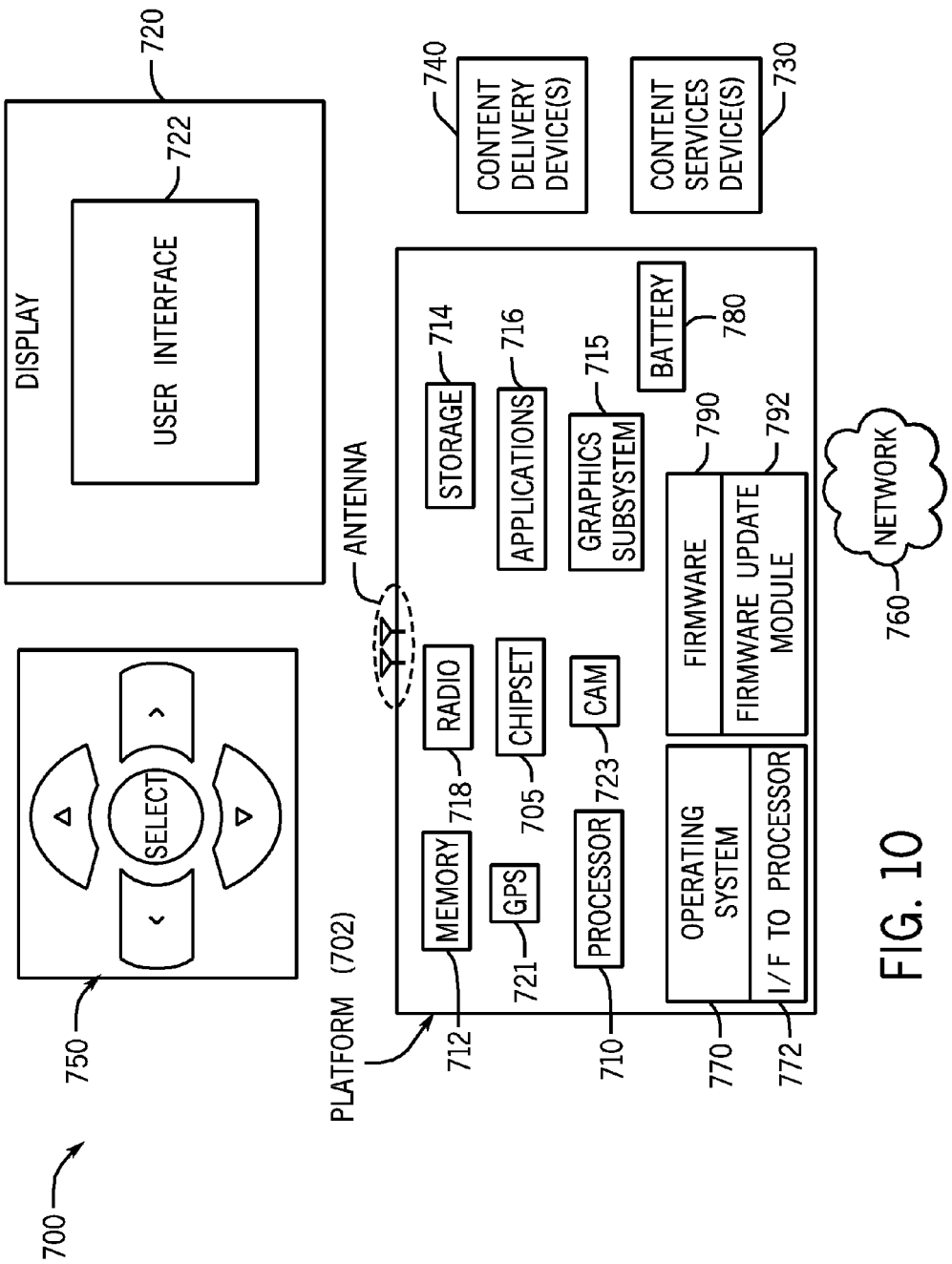
FIG. 10 is a system depiction for one embodiment.

FIG. 10 illustrates an embodiment of a system 700. In embodiments, system 700 may be a media system although system 700 is not limited to this context. For example, system 700 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 700 comprises a platform 702 coupled to a display 720. Platform 702 may receive content from a content device such as content services device(s) 730 or content delivery device(s) 740 or other similar content sources. A navigation controller 750 comprising one or more navigation features may be used to interact with, for example, platform 702 and/or display 720. Each of these components is described in more detail below.

In embodiments, platform 702 may comprise any combination of a chipset 705, processor 710, memory 712, storage 714, graphics subsystem 715, applications 716 and/or radio 718. Chipset 705 may provide intercommunication among processor 710, memory 712, storage 714, graphics subsystem 715, applications 716 and/or radio 718. For example, chipset 705 may include a storage adapter (not depicted) capable of providing intercommunication with storage 714.

Processor 710 may be implemented as Complex Instruction Set Computer (CISC) or Reduced Instruction Set Computer (RISC) processors, x86 instruction set compatible processors, multi-core, or any other microprocessor or central processing unit (CPU). In embodiments, processor 710 may comprise dual-core processor(s), dual-core mobile processor(s), and so forth. The processor may implement the sequences of FIGS. 4, 5, 6 and 9 together with memory 712.

Memory 712 may be implemented as a volatile memory device such as, but not limited to, a Random Access Memory (RAM), Dynamic Random Access Memory (DRAM), or Static RAM (SRAM).

Storage 714 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 714 may comprise technology to increase the storage performance enhanced protection for valuable digital media when multiple hard drives are included, for example.

Graphics subsystem 715 may perform processing of images such as still or video for display. Graphics subsystem 715 may be a graphics processing unit (GPU) or a visual processing unit (VPU), for example. An analog or digital interface may be used to communicatively couple graphics subsystem 715 and display 720. For example, the interface may be any of a High-Definition Multimedia Interface, DisplayPort, wireless HDMI, and/or wireless HD compliant techniques. Graphics subsystem 715 could be integrated into processor 710 or chipset 705. Graphics subsystem 715 could be a stand-alone card communicatively coupled to chipset 705.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Radio 718 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 718 may operate in accordance with one or more applicable standards in any version.

In embodiments, display 720 may comprise any television type monitor or display. Display 720 may comprise, for example, a computer display screen, touch screen display, video monitor, television-like device, and/or a television. Display 720 may be digital and/or analog. In embodiments, display 720 may be a holographic display. Also, display 720 may be a transparent surface that may receive a visual projection. Such projections may convey various forms of information, images, and/or objects. For example, such projections may be a visual overlay for a mobile augmented reality (MAR) application. Under the control of one or more software applications 716, platform 702 may display user interface 722 on display 720.

In embodiments, content services device(s) 730 may be hosted by any national, international and/or independent service and thus accessible to platform 702 via the Internet, for example. Content services device(s) 730 may be coupled to platform 702 and/or to display 720. Platform 702 and/or content services device(s) 730 may be coupled to a network 760 to communicate (e.g., send and/or receive) media information to and from network 760. Content delivery device(s) 740 also may be coupled to platform 702 and/or to display 720.

In embodiments, content services device(s) 730 may comprise a cable television box, personal computer, network, telephone, Internet enabled devices or appliance capable of delivering digital information and/or content, and any other similar device capable of unidirectionally or bidirectionally communicating content between content providers and platform 702 and/display 720, via network 760 or directly. It will be appreciated that the content may be communicated unidirectionally and/or bidirectionally to and from any one of the components in system 700 and a content provider via network 760. Examples of content may include any media information including, for example, video, music, medical and gaming information, and so forth.

Content services device(s) 730 receives content such as cable television programming including media information, digital information, and/or other content. Examples of content providers may include any cable or satellite television or radio or Internet content providers. The provided examples are not meant to limit embodiments of the invention.

In embodiments, platform 702 may receive control signals from navigation controller 750 having one or more navigation features. The navigation features of controller 750 may be used to interact with user interface 722, for example. In embodiments, navigation controller 750 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 750 may be echoed on a display (e.g., display 720) by movements of a pointer, cursor, focus ring, or other visual indicators displayed on the display. For example, under the control of software applications 716, the navigation features located on navigation controller 750 may be mapped to virtual navigation features displayed on user interface 722, for example. In embodiments, controller 750 may not be a separate component but integrated into platform 702 and/or display 720. Embodiments, however, are not limited to the elements or in the context shown or described herein.

In embodiments, drivers (not shown) may comprise technology to enable users to instantly turn on and off platform 702 like a television with the touch of a button after initial boot-up, when enabled, for example. Program logic may allow platform 702 to stream content to media adaptors or other content services device(s) 730 or content delivery device(s) 740 when the platform is turned "off." In addition, chip set 705 may comprise hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various embodiments, any one or more of the components shown in system 700 may be integrated. For example, platform 702 and content services device(s) 730 may be integrated, or platform 702 and content delivery device(s) 740 may be integrated, or platform 702, content services device(s) 730, and content delivery device(s) 740 may be integrated, for example. In various embodiments, platform 702 and display 720 may be an integrated unit. Display 720 and content service device(s) 730 may be integrated, or display 720 and content delivery device(s) 740 may be integrated, for example. These examples are not meant to limit the invention.

In various embodiments, system 700 may be implemented as a wireless system, a wired system, or a combination of both. When implemented as a wireless system, system 700 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 700 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 702 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 10.

Figure 11:
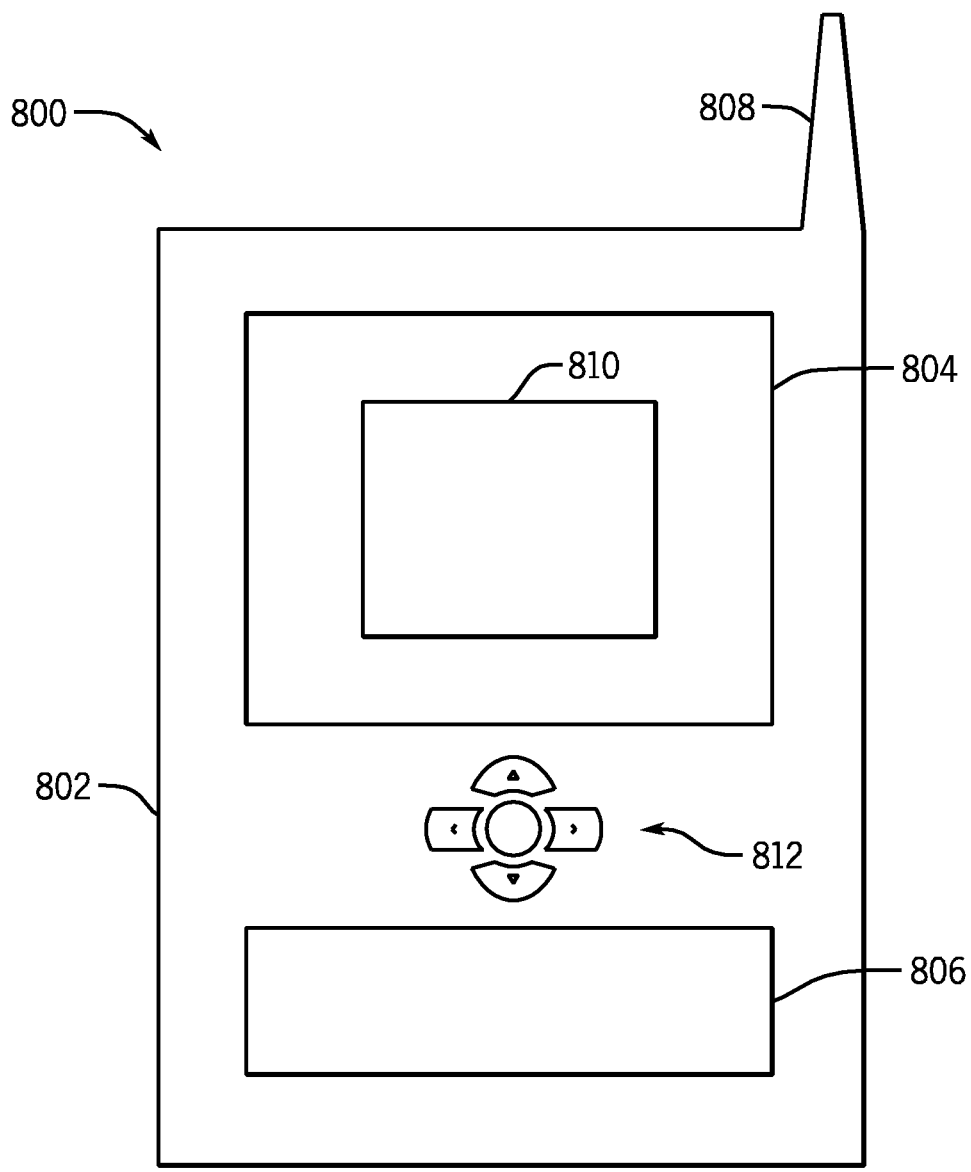
FIG. 11 is a front elevational view of one embodiment.

As described above, system 700 may be embodied in varying physical styles or form factors. FIG. 11 illustrates embodiments of a small form factor device 800 in which system 700 may be embodied. In embodiments, for example, device 800 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

The processor 710 may communicate with a camera 722 and a global positioning system sensor 720, in some embodiments. A memory 712, coupled to the processor 710, may store computer readable instructions for implementing the sequences shown in FIGS. 4, 5, 6 and 9 in software and/or firmware embodiments.

As shown in FIG. 11, device 800 may comprise a housing 802, a display 804, an input/output (I/O) device 806, and an antenna 808. Device 800 also may comprise navigation features 812. Display 804 may comprise any suitable display unit for displaying information appropriate for a mobile computing device. I/O device 806 may comprise any suitable I/O device for entering information into a mobile computing device. Examples for I/O device 806 may include an alphanumeric keyboard, a numeric keypad, a touch pad, input keys, buttons, switches, rocker switches, microphones, speakers, voice recognition device and software, and so forth. Information also may be entered into device 800 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

The graphics processing techniques described herein may be implemented in various hardware architectures. For example, graphics functionality may be integrated within a chipset. Alternatively, a discrete graphics processor may be used. As still another embodiment, the graphics functions may be implemented by a general purpose processor, including a multicore processor.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A computer executed method comprising:
providing a first string of bits to record a fuse state, including at least one complement bit;
storing said first string along an addressable line in an array and storing a second string that is a complement of the first string along a second addressable line in said array in a different direction so that one of said first and second strings is stored in an addressable line in a first direction of said array while the other string is stored in an addressable line in a second direction traverse to said first direction of said array;
only reading said bits in addressable line in the first direction and not reading any addressable lines in the second direction; and
comparing said first string and said second string after reading the addressable lines in the first direction without having read any addressable lines in the second direction.

2. The method of claim 1 further including receiving a bit to store and creating a multi-bit first string from said bit.

3. The method of claim 2 including reading a row and extracting a bit and reading the column.

4. The method of claim 3 including comparing the code and its complement.

5. The method of claim 4 including rejecting the code if the first and second strings do not match as code and code complement.

6. The method of claim 1 including randomly selecting a fuse address to begin fuse sensing.

7. The method of claim 1 including selecting fuse addresses in a first fuse array that has an on-die programmable fuse array and including a second fuse array that is only accessible separately from said first fuse array.

8. An apparatus comprising:
a fuse array having address lines; and
a control to store a value along a first addressable line in an array as a string of bits of at least two different states and to store a complement string along a second addressable line in said array perpendicular to said first address line of said array, only read said bits in addressable line in the first direction and not read any addressable lines in the second direction and compare said first string and said second string after reading the addressable lines in the first direction without having read any addressable lines in the second direction.

9. The apparatus of claim 8, said apparatus to receive a bit to store and create a multi-bit first string from said bit.

10. The apparatus of claim 8, said control to read a row and extracting the bit and reading a column.

11. The apparatus of claim 10, said control to compare the code and its complement.

12. The apparatus of claim 11, said control to reject the code if the first and second strings do not match as code and code complement.

13. The apparatus of claim 8, said control to randomly select a fuse address to begin fuse sensing.

14. The apparatus of claim 8, said control to select fuse addresses in a first fuse array that has an on-die programmable fuse array and including a second fuse array that is only accessible separately from said first fuse array.

15. The apparatus of claim 8 including a random number generator, and a linear feedback shift register coupled to said generator.

16. The apparatus of claim 15 including a fuse array coupled to said register.

17. The apparatus of claim 16 wherein said register to randomly pick fuse array addresses.

18. The apparatus of claim 8 wherein said fuse array is an on-die programmable fuse array.

19. The apparatus of claim 8 including a second array that is not on-die programmable, said first and second arrays being accessed using different passwords.

20. The apparatus of claim 8 including an operating system.

21. The apparatus of claim 8 including a battery.

22. The apparatus of claim 8 including firmware and a module to update said firmware.

23. One or more non-transitory computer readable media storing instructions to enable a processor to perform a sequence comprising:

providing a first string of bits to record a state, including at least one complement bit;

storing said first string along an addressable line in an array in a first direction and storing a second string that is a complement of the first string along a second addressable line in said array in a different direction;

only reading said bits in addressable line in the first direction and not reading any addressable lines in the second direction; and comparing said first string and said second string after reading the addressable lines in the first direction without having read any addressable lines in the second direction.

24. The media of claim 23, said sequence to receive a bit to store and creating a multi-bit first string from said bit.

25. The media of claim 24, said sequence to read a row and extracting the bit and reading a column.

26. The media of claim 25, said sequence to compare the code and its complement.

27. The media of claim 26, said sequence to reject the code if the first and second strings do not match as code and code complement.

28. The media of claim 23, said sequence to randomly select a fuse address to begin fuse sensing.

29. The media of claim 23, said sequence to select fuse addresses in a first fuse array that has an on-die programmable fuse array and including a second fuse array that is only accessible separately from said first fuse array.

* * * * *